United States Patent [19]

Haas et al.

[11] 4,107,555

[45] Aug. 15, 1978

[54] PROXIMITY SWITCH AND CIRCUIT SYSTEM

[75] Inventors: Lothar Haas; Rolf Bräutigam, both of Nuremberg; Albert Weckenmann, Ahrensburg, all of Fed. Rep. of Germany

[73] Assignee: Robert Bosch GmbH, Stuttgart, Fed. Rep. of Germany

[21] Appl. No.: 771,806

[22] Filed: Feb. 24, 1977

[30] Foreign Application Priority Data

Mar. 5, 1976 [DE] Fed. Rep. of Germany ....... 2609077

[51] Int. Cl.² .................. H03K 17/00; G01R 27/26
[52] U.S. Cl. ................. 307/308; 324/61 R; 328/5; 331/65; 307/303
[58] Field of Search ........... 324/61 R, 61 P; 328/5; 331/65, 258 B; 340/365 C; 307/308

[56] References Cited

U.S. PATENT DOCUMENTS

| 3,758,855 | 9/1973 | Meyer ............................... 331/65 |
| 3,944,843 | 3/1976 | Vaz Martins ....................... 328/5 |
| 4,016,490 | 4/1977 | Weckenmann et al. ........... 324/61 R |

Primary Examiner—Stanley D. Miller, Jr.
Assistant Examiner—B. P. Davis
Attorney, Agent, or Firm—Flynn & Frishauf

[57] ABSTRACT

Two surface electrodes are applied to an insulating substrate. The surface electrodes are totally surrounded by a metallic shield which is electrically floating, one of the electrodes being an emitter electrode emitting ac radiation and the other a receiving electrode. A portion of the emitted field is conducted by the shield. Upon approach, or touching of the shield by a grounded body, for example by the hand of a user, the field distribution within the shield will change and the radiation received by the receiving electrode will likewise change. In accordance with the present invention, an integrated circuit (IC) evaluation circuit is located beneath the metallic shield on the insulating substrate, the surface electrodes as well as external terminals passing through the insulated substrate being connected to the IC. Preferably, the shield is a plastic cap which is metallized, formed with snap tongs to snap over the insulated substrate.

15 Claims, 3 Drawing Figures

PROXIMITY SWITCH AND CIRCUIT SYSTEM

Cross reference to related application United States Ser. No. 637,181, filed Dec. 3, 1975, now U.S. Pat. No. 4,016,490 Apr. 5, 1977 assigned to the assignee of the present.

The present invention relates to a proximity switch and circuit combination system having an insulated substrate on which surface electrodes are applied, one of the surface electrodes providing a radiation field which is at least in part drawn off by an electrically floating metallic shield. Upon approach of the metallic shield by a grounded body, for example the finger of a user, the radiation received by the other, or receiving electrode will change, thus providing an output signal which can be evaluated to sense the proximity of the grounded body. This system is explained in detail in the cross referenced application U.S. Ser. 637,181, Filed Dec. 3, 1975 now U.S. Pat. No. 4,016,490 Apr. 5, 1977.

The general proximity sensing system is a capacitative sensor. When not touched by a grounded body, the metallic shield results in a predetermined received signal at the receiving electrode. This received signal is independent of contamination, dirt, change in ambient conditions for example, humidity, and the like at the outside of the shield itself. The shield, in effect, acts as a Faraday cage. Such a proximity sensor can readily be connected to form a proximity switch and is a preferred form of switch for use in automotive vehicles, or in other installations where reliability of operation regardless of possible contamination, or lack of maintenance is important. For example, if the driver of the vehicle touches, or approaches (for example through a glove) the shield, high frequency signal current being drawn off thereby is grounded through the finger and body of the person of the user, thus changing, in decreasing direction, the measuring current at the receiving electrode.

Proximity, or touch switches of this type can be placed in automotive vehicles at various desired locations, for example, on a dashboard, in the region of the steering wheel, and other convenient places. It is desirable that the switches directly include the respective electronic evaluation circuitry which finally control the switching element of the load controlled by the respective switch.

It is an object of the present invention to reduce the requirement for space to locate evaluation circuitry, to reduce the length of conductors carrying sensitive signals or possibly themselves causing radiation, and thus possible radio interference, and to improve the applicability of touch controlled or proximity controlled switches of this type in automotive vehicular surroundings.

SUBJECT MATTER OF THE PRESENT INVENTION

Briefly, the electronic evaluation circuit is constructed as an integrated circuit (IC), located within the metallic shielding of the switch and located on the very same insulating plate which is also the carrier for the surface electrodes.

In accordance with a feature of the invention, the IC element is adhesively secured between the surface electrodes thus resulting in a particularly compact arrangement requiring a minimum of space.

The invention will be described by way of example with reference to the accompanying drawings, wherein.

Figure 1:
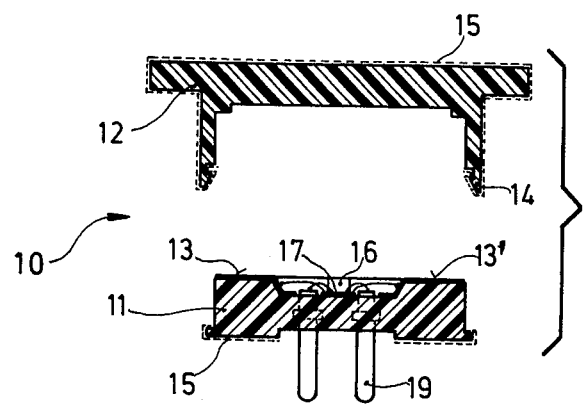
FIG. 1 is an exploded view, to an enlarged scale, of a touch sensitive switch with an IC circuit thereon before assembly of the cover to the insulating substrate or carrier.
Figure 2:
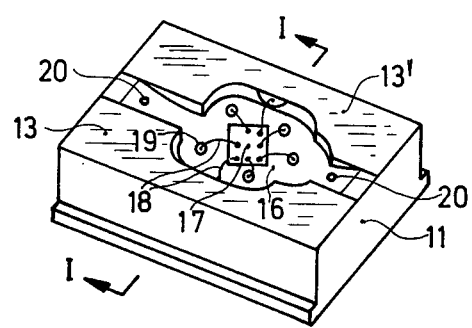
FIG. 2 is a perspective view of the substrate with the surface elctrodes and the IC circuit thereon, with the cover plate removed.

The sensor 10 (FIGS. 1 and 2) basically has an insulting substrate carrier 11 and a cover plate 12. The substrate plate 11 has two surface electrodes 13, 13' on one surface thereof; one of the electrodes is the transmitting electrode the other the receiving electrode. The cover plate 12 covers the substrate 11 at the side on which the electrodes 13, 13' are applied. The cover plate 12 is formed with depending snap tongues, also well seen in FIG. 3, which can snap around a bead formed at the lower edge of the substrate 11. Upon pressing cover plate 12 over the substrate 11, the snap tongues will engage around the substrate 11 to connect the two units as one combined element. The outer surface of cover plate 12 as well as the backside of the insulating plate 11 is covered with a metallizing layer 15, shown schematically by the broken line, and forming a metallic shield for the surface electrodes 13. The snap tongues 14 are likewise metallized and form a connection for the metallization on the cap with the metallization at the bottom of the insulating substrate plate 11, so that the surface electrodes 13, 13' are effectively entirely surrounded by the shielding 15.

The surface electrodes 13 are separated from each other by a break 16, formed as a notch in the insulating substrate plate 11. An integrated circuit (IC) element 17 is adhesively secured to the substrate 11. The IC 17 is connected by connecting wires 18 with surface electrodes 13, 13' as well as with terminal pins 19, sealed through and secured in the insulating plate 11. The terminals 19 form connecting elements for connection of the touch sensitive, or proximity sensitive switch and circuit combination to external circuits not shown. The notch 16 in the insulating plate 11 in which the IC element 17 as well as the contact wires 18 are located is filled with silicone rubber or similar resilient insulating material after the cap 12 has been secured to the substrate 11. The silicone rubber is introduced through bores 20 from the outside into the notch or groove 16. A representation of the silicone rubber, which may be transparent, has been omitted from the drawings for clarity and to permit ready visualization and the like.

If the finger of a user approaches, or touches the metallizing 15, then a major portion of the field transmitted by the transmitting electrode is conducted away from the shield, thus substantially reducing the intensity of the received current in the receiving electrode 13'. The evaluation IC 17 then will sense the attenuation of this current and provide a suitable switching signal in response thereto. The IC may, additionally, inherently include a logic circuit, for example by energizing different switching terminal pins 19 upon successive sensing of switching events.

Figure 3:
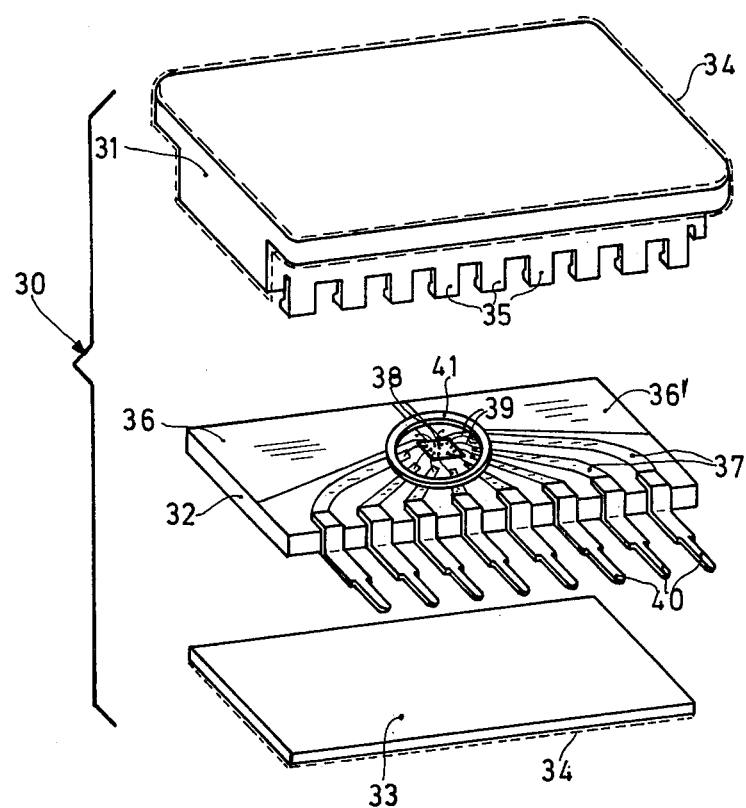
FIG. 3 is an exploded perspective view of another embodiment of the invention using a printed circuit board as the substrate.

Embodiment of FIG. 3: Sensor 30 essentially comprises three stacked parts: a cover cap 31, an insulating substrate 32 and a base plate 33. The cover plate 31 is similar to that illustrated in FIG. 1 and covered with an autometallization 34; it has laterally arranged snap tongues 35. The insulating substrate 32 is formed similarly to a printed circuit. It is supplied with a copper surface on which the two surface electrodes 36, 36' are arranged, and further formed with several connecting paths 37. The shape of the connecting paths as well as the surface electrodes 36 is readily visible in FIG. 3, and obtained by suitable etching of the copper coating on the insulating substrate, as well known in connection with printed circuit technology. The space between the separated surface electrodes 36, 36' of the placement of the IC element 17, the electrodes 13, and the terminals 19.

Operation: Terminals 19 connect the sensing element 10 and the IC element 17 therein to the on-board network of an automotive vehicle. The IC element 17 includes an oscillator generating a frequency of about 30khz. Additionally, IC 17 includes the evaluation circuit or the determination of change of the signal received by the receiving electrode. The high frequency signal generated by the oscillator is connected over one of the connecting wires 18 from the IC 17 to one of the surface electrodes, for example electrode 13, forming the transmitting electrode. Since the two surface electrodes 13, 13' are galvanically isolated from each other but totally surrounded by the metallizing shield 15; a major portion of the field from the transmitting electrode is transmitted through the metallizing 15 to the receiving electrode, for example electrode 13'. The current arising in the receiving electrode is applied through another one of the connecting wires 18 to the IC 17, for evaluation of the strength thereof. This evaluation circuit may include amplifiers, flip-flops, and the like. The output of the evaluation circuit is connected over connecting wires 18 with suitable connecting pins 19, which, in turn, can control relays or other control switches to, in turn, control operation of loads in the automotive vehicle, for example connection of lights, direction signals, and the like, upon approaching metallization 15, a major portion of the field from the transmitting electrode and passing through the field is externally bypassed, so that the current applied to the receiving electrode and then to the IC element is substantially attenuated. This attenuation triggers the respective switching signal.

FIG. 3 illustrates another example of a sensor. Sensor 30 essentially consists of three superimposed stacked elements: a cover cap 31, an insulating plate 32, and a base plate 33. The cover cap 31 is similar to cover cap 12 (FIG. 1) and externally metallized by a metallization coating 34. It is formed with laterally extending snap tongues 35. The insulating plate 32 forms a printed circuit; it may, for example, be copper plated on which the two surface electrodes 36, as well as various circuit paths are obtained by etching away selected regions of the copper plating or copper coating of insulating plate 32. The insulating plate 32 forms a substrate separating the surface electrode 36. Insulating plate 32 is used to locate an IC 38 thereon, secured to the substrate 32 by an adhesive and connected by means of connecting leads 39 to the respective surface electrodes 36, 36' as well as to the connecting paths 37 of the printed circuit. The connecting paths 37 are carried out to one side of the insulated plate 32 to be there connected to pin terminals 40, projecting laterally from the printed circuit board forming the substrate 32. The base plate 33 is metallized at its backside with the metallization 34. Upon associating the three elements together and snapping the tongues 35 over the base plate 33, the sensor will form one complete assembly. The IC 38 as well as the printed circuit board 32 are beneath the cover plate 31, the surface electrodes 36, 36' being totally surrounded by the metallization of the cover plate 31 and of the base plate 33. The snap tongues 53 insure electrical connection of the metallization on the base plate 33 to the metallization on the cover 31. Thus, the surface electrodes 36, as well as the IC 38 are totally surrounded by a shield. The shield is not connected to any terminal and not grounded and may be considered to be electrically floating. The IC 38 is mechanically protected against damage by a coating of silicone rubber, which also protects the connecting leads 39. Additional protection can be obtained by locating a ring 41 of insulating material around the IC 38. Preferably, the cover plate 31 is formed with a suitable circular groove in which the ring 41 can engage, thereby forming a complete and reliable protection for the IC 38. The silicone rubber can be filled within the space of the insulating ring 41 before assembly of the elements, or can be filled after the three plates have been assembled together through an opening similar to opening 20 (FIGS. 1 and 2); this is not shown in FIG. 3.

Operation of sensor 30: Basically, the operation is identical to that described in connection with sensor 10, FIGS. 1 and 2. The connecting pins 40 are energized with a supply voltage derived from a source and other terminal pins provide control signals, or permit application of control signals. For example, an output signal can be derived upon first operating the sensor, or output signals can be intermittently obtained to provide for electronic flashing control of flashing direction signals, or external cancellation signals, for example for direction signal reset can be applied to the IC included in the sensor and providing the flashing control for the switch.

Various change and modifications may be made, and features described in connection with any one of the embodiments may be used with any of the other, within the scope of the inventive concept.

The circuits hard wired into the ICs 17, 38, may be any well known standard oscillator or circuits, for example as shown in electronic circuits manual, flip-flop or other amplifiers, or, for example, intermittent flashing circuits as shown in GE transistor manual.

We claim:
1. Proximity switch and circuit system having
   an insulating substrate (11, 32);
   two surface electrodes (13, 13'; 36, 36') on the substrate insulated from each other, one electrode forming a transmitting electrode and the other a receiving electrode to receive radiation transmitted from the transmitting electrode;
   an electrically floating metallic shield (15, 34) covering the electrodes and insulated therefrom and from ground,
   whereby at least a portion of the field upon transmission of radiation by the transmitting electrode will pass through the shield to affect the receiving electrode and, upon approach in the proximity of the shield (15, 34) or contact therewith of a grounded mass, the field passing through the shield will change, thus changing the received radiation and providing, in the receiving electrode, a proximity sensing signal
   comprising, in accordance with the invention
   an integrated circuit (IC) element (17, 38) located beneath the metallic shield (15), the IC element being secured to the insulating substrate (11, 32) to which the surface electrodes are also secured;

terminals (19, 40) secured to the substrate (11, 32);
and connection means (18, 37) respectively connecting the IC element (17, 38) to the surface electrodes (13, 13'; 36, 36') and to the terminals (19, 40).

2. System according to claim 1 wherein the IC element (17, 38) is adhesively secured to the insulating substrate (11, 32) and located between the surface electrodes (13, 13'; 36, 36').

3. System according to claim 2 wherein the substrate (11) is formed with a recess, or groove or notch (16) separating the surface electrodes (13, 13') from each other;
and wherein the IC element (17) is secured within the recess (16).

4. System according to claim 3 wherein at least one of the terminals (19) is secured to the substrate (11) in the region of the recess (16).

5. System according to claim 3 further comprising a silicone rubber filling, filling the space of the recess (16).

6. System according to claim 2 wherein (FIG. 3) the insulating substrate (32) is formed with selectively positioned copper coating, the copper coating forming the surface electrodes (36, 36') and circuit paths (37) as a printed circuit board;
and wherein the terminals (40) project laterally from the printed circuit board, the terminals connecting with the connecting paths (37).

7. System according to claim 6 further comprising connecting leads (39) connecting the IC element (38) to the connecting path (37) forming the printed circuit board.

8. System according to claim 3 further comprising connecting leads (18) connecting the IC element (17) to the terminals (19).

9. System according to claim 1 further comprising a cover cap (12, 31) located at the side of the substrate on which the surface electrodes (13, 13'; 36, 36') are applied.

10. System according to claim 9 wherein (FIG. 1) the outer surface of the cover cap (12) as well as the side of the substrate plate (11) which does not have the surface electrodes (13, 13') secured thereto are entirely metallized except for the region immediately surrounding the terminals (19).

11. System according to claim 9 further comprising a base plate (33) metallized at one side thereof, the outer surface of the cover cap (31) as well as the metallized surface of the base plate being in electrical contacting engagement and assembled together in sandwich form to totally surround the top, and bottom of the insulating substrate plate (32) with an insulating metallic shield (34).

12. System according to claim 11 further comprising metallized snap catch tongues (35) secured to the cover plate (31), the metallized snap catch tongue contacting the metallization on the base plate (34) and providing for continuous metallic contact of the metallization of the cap to the base plate.

13. System according to claim 10 further comprising metallized snap catch tongues (14) secured to the cap (12) and providing for electrical metallic contact between the metallization of the cap and the metallization at the bottom of the substrate plate (11).

14. System according to claim 1 wherein the integrated circuit element (17, 38) comprises an oscillator providing an output frequency in the order of about 30kHz to one of the electrodes forming the transmitting electrode, and a receiving evaluation circuit connected to the other, or receiving electrode.

15. A system according to claim 14 wherein the integrated circuit element further includes a logic circuit controlling operations in accordance with the hard wired logic of the integrated circuit.

* * * * *